(12) United States Patent
Ueda et al.

(10) Patent No.: US 9,059,105 B2
(45) Date of Patent: Jun. 16, 2015

(54) ASHING APPARATUS

(75) Inventors: Masahisa Ueda, Susono (JP); Takashi Kurimoto, Susono (JP); Michio Ishikawa, Susono (JP); Koukou Suu, Susono (JP); Toshiya Yogo, Kasugai (JP)

(73) Assignee: Ulvac, Inc., Kanagawa (JP)

( * ) Notice: Subject to any disclaimer, the term of this patent is extended or adjusted under 35 U.S.C. 154(b) by 1011 days.

(21) Appl. No.: 12/442,834

(22) PCT Filed: Dec. 26, 2007

(86) PCT No.: PCT/JP2007/074980
§ 371 (c)(1),
(2), (4) Date: Mar. 25, 2009

(87) PCT Pub. No.: WO2009/022440
PCT Pub. Date: Feb. 19, 2009

(65) Prior Publication Data
US 2010/0089533 A1 Apr. 15, 2010

(30) Foreign Application Priority Data

Aug. 16, 2007 (JP) .................................. 2007-212409
Nov. 5, 2007 (JP) .................................. 2007-287340

(51) Int. Cl.
| C23C 16/00 | (2006.01) |
| C23F 1/00 | (2006.01) |
| H01L 21/306 | (2006.01) |

(Continued)

(52) U.S. Cl.
CPC ....... H01L 21/31138 (2013.01); H01J 37/3244 (2013.01)

(58) Field of Classification Search
CPC ..................... H01L 21/3065; H01L 21/31138; H01J 37/3244; H01J 37/32357; H01J 37/32009
USPC ......... 156/345.33–345.35; 118/715, 723 ME, 118/723 ER, 723 IR
See application file for complete search history.

(56) References Cited

U.S. PATENT DOCUMENTS 5,013,400 A * 5/1991 Kurasaki et al. .............. 438/713
5,766,498 A    6/1998 Kojima et al.

(Continued)

FOREIGN PATENT DOCUMENTS

| DE | 101 19 766 A1 | 11/2001 |
| JP | 63-58933 | 3/1988 |

(Continued)

OTHER PUBLICATIONS

Machine Translation of JP 10-150026, Mihara et al dated Jun. 2, 1998.*

(Continued)

*Primary Examiner* — Rakesh Dhingra
(74) *Attorney, Agent, or Firm* — Christensen Fonder P.A.

(57) ABSTRACT

Disclosed is an ashing apparatus and its method of manufacture wherein decrease in processing efficiency is suppressed. Specifically, a shower plate is arranged to face a substrate stage on which a substrate is placed, and diffuses oxygen radicals supplied into a chamber. A metal blocking plate is arranged between the shower plate and the substrate stage and has a through hole through which oxygen radicals pass. In addition, the metal blocking plate has a first layer, which is made of a metal same as the one exposed in the substrate, on the surface facing the substrate.

13 Claims, 9 Drawing Sheets

(51) Int. Cl.
*H01L 21/311* (2006.01)
*H01J 37/32* (2006.01)

(56) References Cited

U.S. PATENT DOCUMENTS

| | | | |
|---|---|---|---|
| 5,846,885 A | | 12/1998 | Kamata et al. |
| 6,162,323 A | * | 12/2000 | Koshimizu ............... 156/345.26 |
| 6,502,530 B1 | | 1/2003 | Turlot et al. |
| 6,991,739 B2 | * | 1/2006 | Kawaguchi et al. ............ 216/67 |
| 7,297,635 B2 | | 11/2007 | Toda et al. |
| 7,811,409 B2 | * | 10/2010 | Egley et al. ............... 156/345.34 |
| 2002/0144785 A1 | * | 10/2002 | Srivastava et al. ....... 156/345.35 |
| 2004/0238123 A1 | * | 12/2004 | Becknell et al. ......... 156/345.33 |
| 2005/0133160 A1 | | 6/2005 | Kennedy et al. |
| 2006/0081337 A1 | * | 4/2006 | Himori et al. ............ 156/345.47 |
| 2007/0051471 A1 | * | 3/2007 | Kawaguchi et al. ...... 156/345.36 |
| 2007/0087579 A1 | | 4/2007 | Kitayama et al. |
| 2007/0298617 A1 | | 12/2007 | Toda et al. |

FOREIGN PATENT DOCUMENTS

| | | |
|---|---|---|
| JP | 9-027398 | 1/1997 |
| JP | 09-045495 | 2/1997 |
| JP | 09-120957 | 5/1997 |
| JP | 10-150026 | 6/1998 |
| TW | 561546 | 11/2003 |
| TW | 200710985 | 3/2007 |
| WO | WO 2005/098922 A1 | 10/2005 |

OTHER PUBLICATIONS

Machine Translation of JP 09-045495, Hideki et al dated Feb. 14, 1997.*

* cited by examiner

ASHING APPARATUS

FIELD OF THE INVENTION

The present invention relates to an ashing device for performing ashing (incineration) to remove organic materials from a substrate.

BACKGROUND OF THE INVENTION

In the prior art, to form an integrated circuit on a semiconductor substrate, a resist film on which is formed a circuit pattern is arranged on the surface of a semiconductor substrate. Then, layers under the resist film, such as an insulation film, a semiconductor film, or a metal film, are etched through the resist film. The resist film is removed from the substrate surface after ending the etching process. One example of a method for removing the resist film is a dry processing method for ashing (incinerating) the resist film using the plasma of reactive gas, mainly oxygen plasma.

The dry processing method causes reaction of active species (radicals), mainly oxygen radicals, generated in the plasma of the reactive gas, in the resist film applied to the substrate, to decompose and vaporize the resist film to $CO_2$ and $H_2O$ for removal. Patent document 1 discloses an example of a plasma ashing device for removing a resist film through the dry processing method. This ashing device will be described with reference to FIG. 7.

As shown in FIG. 7, an ashing device includes a chamber (processing chamber) 1, the upper part of which is coupled to a feed tube 2. The feed tube 2 is connected to a plasma chamber (not shown) which generates plasma. A shower plate 3, which includes a plurality of through holes, is arranged at the lower end of the feed tube 2 facing toward a substrate stage 4. A cylindrical diffusion prevention wall 5 is attached to an upper inner surface of the processing chamber 1 so as to extend around the shower plate 3. A high frequency power supply 6 is connected to the substrate stage 4. A ventilation port 7 is formed at the bottom of the chamber 1.

The ashing process performed by the ashing device of FIG. 7 will now be described. First, a substrate (wafer) W arranged in the chamber 1 is mounted on an upper surface of the substrate stage 4. The interior of the chamber 1 is depressurized, and high frequency voltage is applied to the substrate stage 4. Then, gas containing oxygen radicals is supplied to the chamber 1 through the feed tube 2. The gas containing oxygen radicals flows through the through holes of the shower plate 3 and reaches the substrate W. The gas flowing outward from the shower plate 3 is guided by the diffusion prevention wall 5 towards the substrate W. A resist film (not shown) formed on the upper surface of the substrate W is decomposed and vaporized by the oxygen radicals contained in the gas and then discharged from the ventilation port 7.

In the integrated circuit on the semiconductor substrate, circuit elements such as transistors are connected by a metal wiring of aluminum (Al), copper (Cu), or the like. Some integrated circuits have connection pads of which surfaces are covered by gold (Au) or the like or connection terminals formed from solder. Thus, when manufacturing the semiconductor substrate, during the ashing of the resist film, the metal wiring may be exposed and gold or solder may be formed on the surface. In such a case, the exposed metal material is sputtered by chemical reactions or physical reactions. This scatters metal atoms, and the metal atoms collect on the inner walls of the chamber 1, that is, the lower surface of the shower plate 3 and the inner circumferential surface of the diffusion prevention wall 5. If the ashing process is continued in such a state, the metals collected on the inner walls of the chamber 1 bond with the oxygen radicals that should be guided to the substrate W. This oxidizes the metal surface and increases the amount of deactivated oxygen radicals. In other words, the metal collected on the inner wall of the chamber 1 increases the amount of deactivated oxygen radicals. As a result, the amount of oxygen radicals that reaches the substrate W decreases, and the depth (ashing rate) of the resist film that can be processed during the same time decreases. Furthermore, the metal atoms scattered from the substrate W are collected on the inner walls of the chamber 1 in a non-uniform manner. This lowers the uniformity of the ashing rate in the surface of the substrate W. The inventors of the present invention have confirmed that the metals scattered from the substrate W decrease the ashing rate and lowers the in-surface uniformity through experimental results, which are described below.

FIGS. 9 and 10 are graphs showing the measurement values of the ashing depth in the substrate W. Referring to FIG. 8, the measurement values indicate the ashing depths from the surface of the resist film at forty-nine measurement points on the substrate W, which are set in order from the center of the substrate W in the circumferential direction and the radial direction. In FIGS. 9 and 10, the black circles represent the measurement values taken when performing the ashing process after the chamber 1, the shower plate 3, and the diffusion prevention wall 5 are all washed. The black squares represent the measurement values taken when performing the ashing process again using the used shower plate 3 and diffusion prevention wall 5. The black triangles represent the difference between the measurement value represented by the black circles and the measurement values represented by the black squares.

FIG. 9(a) is a graph showing the measurement results of when a used shower plate 3 and diffusion prevention wall 5, which were used during a previous ashing are set in a new chamber 1, and re-ashing is performed on the substrate W from which copper is exposed under a first ashing condition (processing condition A). FIG. 9(b) is a graph showing the measurement result of when the same process as FIG. 9(a) is performed under a second ashing condition (processing condition B), which differs from the first ashing condition. FIG. 10(a) is a graph showing the measurement results of when a used diffusion prevention wall 5, which were used during a previous ashing are set in a new chamber 1, and re-ashing is performed on the substrate W from which gold is exposed under processing condition A. FIG. 10(b) is a graph showing the measurement result when the same process as FIG. 10(a) is performed under processing condition B. The processing time is the same for each case (30 seconds).

As apparent from FIGS. 9 and 10, when the shower plate 3 and the diffusion prevention wall 5 of the ashing device that have processed a substrate, from which metal (copper, gold) was exposed, are set in a chamber 1, which has been washed, and the ashing process is performed (refer to black squares), the ashing depths all decrease compared to when the ashing process is performed in the ashing device in which the chamber 1, the shower plate 3, and the diffusion prevention wall 5 are all washed (refer to black circles). In particular, in FIG. 9(a), the ashing depths of the measurement points 1 to 9 and the measurement points 26 to 49 under the condition represented by the black squares are significantly decreased, and in FIG. 10, the ashing depths of the measurement points 26 to 49 under the condition represented by the black squares decrease significantly. In the case of the condition represented by the black squares, a large amount of the oxygen radicals that should reach the measurement points 1 to 9 and 26 to 49 are supplied toward the measurement points via the shower plate 3 or the diffusion prevention wall 5 on which metals are collected. It is thus assumed that the metals collected on the shower plate 3 and the diffusion prevention wall 5 deactivate a large amount of oxygen radicals thereby significantly decreasing the amount of oxygen radicals that reach the measurement points 1 to 9 and 26 to 49 and significantly decreasing the ashing depth at such measurement points.

This also shows that the amount of metal collected in the path of the oxygen radicals (shower plate 3, diffusion prevention wall 5, etc.) varies the amount of oxygen radicals that reach each measurement point. This, in turn, varies the ashing depth at each measurement point. Actually, as apparent from the results shown by the black squares in FIGS. 9 and 10, the ashing depth varies in the surface of the substrate W when the metal distribution state on surfaces facing toward the substrate W is non-uniform, such as when metals are not collected in the chamber 1 but collected on the shower plate 3 and the diffusion prevention wall 5.

Patent Document 1: Japanese Laid-Open Patent Publication No. 9-45495

SUMMARY OF THE INVENTION

The present invention provides an ashing device that prevents the processing efficiency from decreasing over time.

One aspect of the present invention is an ashing device for ashing organic material on a substrate including an exposed metal in a processing chamber. The ashing device includes a stage which holds the substrate. A diffuser plate faces toward the stage which diffuses active species supplied to the processing chamber and includes first through holes through which the active species pass. A porous plate is arranged between the stage and the diffuser plate. The porous plate includes a first layer, facing toward the substrate and formed from the same metal as the exposed metal of the substrate, and second through holes, through which the active species pass.

DETAILED DESCRIPTION OF THE PREFERRED EMBODIMENTS

[First Embodiment]

A first embodiment of an ashing device according to the present invention will now be discussed with reference to FIGS. 1 to 5.

Figure 1:
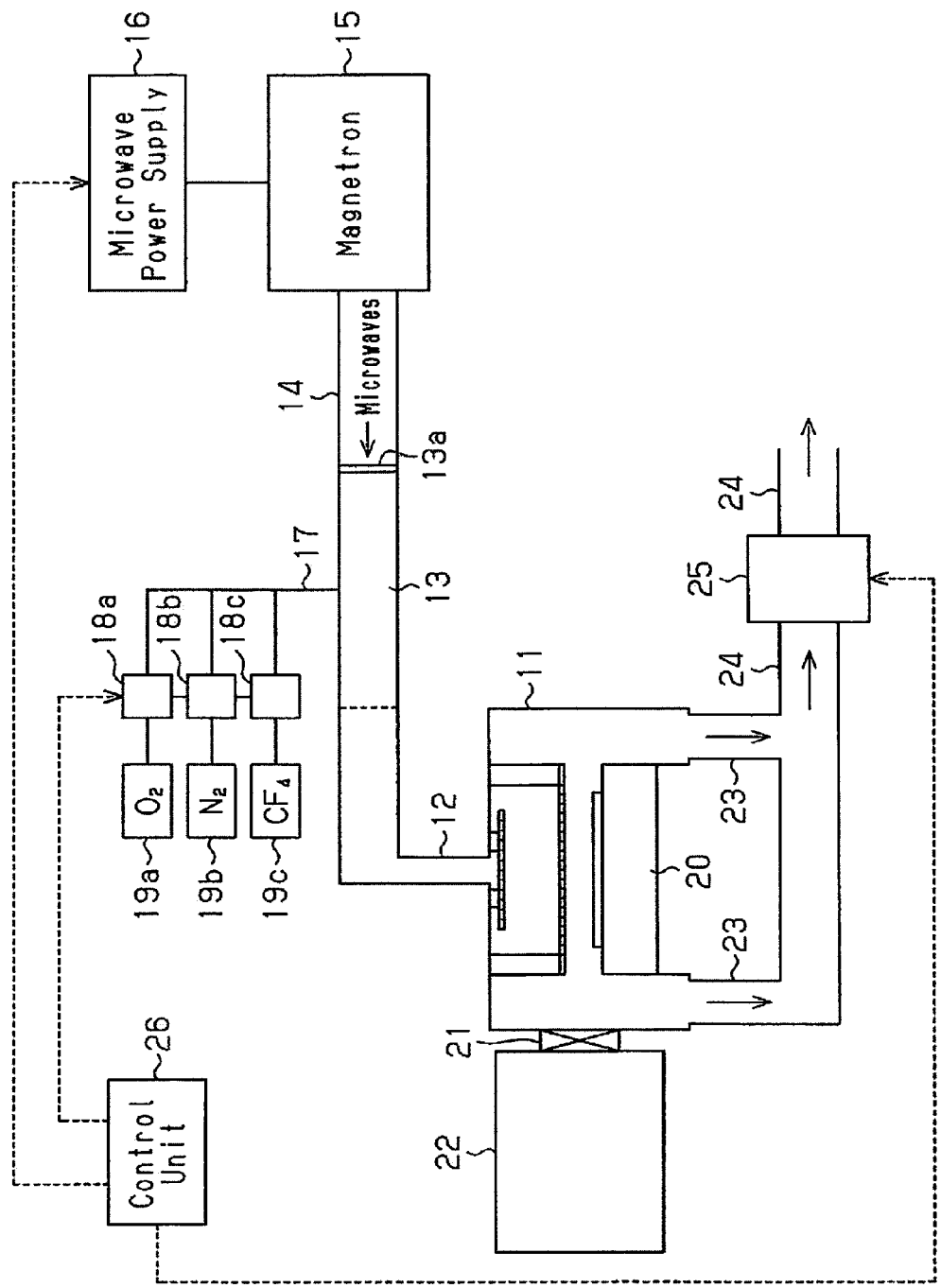
FIG. 1 is a schematic diagram of a first embodiment of an ashing device.

As shown in FIG. 1, the ashing device includes a chamber (processing chamber) 11, the upper part of which is connected to a plasma chamber 13 by a feed tube 12. The plasma chamber 13 is connected to a magnetron 15 by way of a microwave waveguide 14. A microwave transmissive window 13a which is formed from silica or the like, partitions the plasma chamber 13 and the microwave waveguide 14. A microwave power supply 16 is connected to the magnetron 15. Microwaves (μ waves) generated in the magnetron 15 are guided to the plasma chamber 13 through the microwave waveguide 14.

The plasma chamber 13 is connected to a plurality of (three in the drawing) mass flow controllers 18a to 18c by a gas intake tube 17. The mass flow controllers 18a to 18c are respectively connected to gas supply sources 19a to 19c. In the first embodiment, the gas supply source 19a stores oxygen ($O_2$), the gas supply source 19b stores nitrogen ($N_2$), and the gas supply source 19c stores carbon tetrafluoride ($CF_4$). The mass flow controllers 18a to 18c adjust the flow rate of the gas stored in the corresponding gas supply sources 19a to 19c. The oxygen, nitrogen, and carbon tetrafluoride under the predetermined flow rate are mixed to form a reactive gas, which is sent to the plasma chamber 13 through the gas intake tube 17.

The microwaves and reactive gas generates plasma, which contains oxygen, in the plasma chamber 13, and oxygen radicals, which serve as active species in the plasma, are sent to the chamber 11 through the feed tube 12. A substrate stage 20 for holding a substrate W is arranged in the chamber 11. A vacuum auxiliary chamber 22 is connected to the chamber 11 by a gate 21. The vacuum auxiliary chamber 22 is used to prevent the pressure of the chamber 11 from becoming atmospheric when loading and unloading the substrate W.

A ventilation port 23 is formed in the bottom of the chamber 11. The ventilation port 23 is connected to a ventilation pump (not shown) by a ventilation tube 24. The ventilation pump reduces the pressure in the chamber 11. A pressure controller 25 is arranged in the ventilation tube 24 to regulate the pressure in the chamber 11 by driving the ventilation pump.

The microwave power supply 16, the mass flow controllers 18a to 18c, and the pressure controller 25 are connected to a control unit 26. The control unit 26 includes a storage (not shown). The storage stores information (recipes) on the conditions for processing various types of substrates. When the recipe that is in accordance with the substrate W loaded into the chamber 11 is designated, the control unit 26 controls the microwave power supply 16, the mass flow controllers 18a to 18c, the pressure controller 25 based on values of the designated recipe.

The structure of the chamber 11 will now be discussed with reference to FIG. 2.

Figure 2:
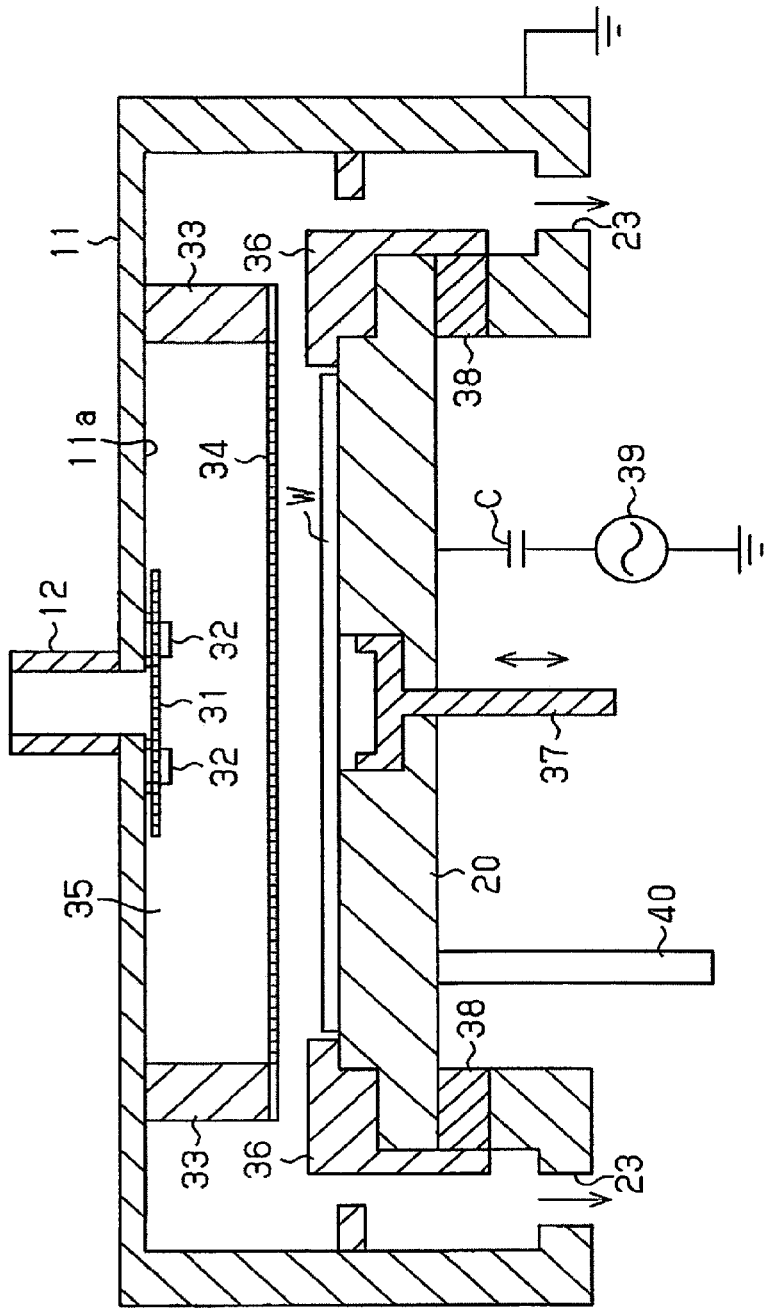
FIG. 2 is a schematic cross-sectional view of a chamber of FIG. 1.

As shown in FIG. 2, the feed tube 12 has a lower end coupled to the upper part of the chamber 11. A shower plate (diffuser plate) 31 is arranged on the lower end. The shower plate 31, which is disk-shaped and which includes a plurality of through holes (first through hole), faces toward the substrate stage 20. The shower plate 31 is fixed to the upper part of the chamber 11 by an attachment member 32. The attachment member 32 spaces the shower plate 31 apart from an upper inner surface 11a by a predetermined distance. The predetermined distance, that is, the distance between the upper inner surface 11a of the chamber 11 and the shower plate 31, is set so that oxygen radicals sent into the chamber 11 from the feed tube 12 pass through the through holes formed in the shower plate 31 and pass through the gap formed between the shower plate 31 and the upper part of the chamber 11 to be guided outward.

A cylindrical diffusion prevention wall 33 has an upper end attached to the upper inner surface 11a of the chamber 11. The diffusion prevention wall 33 extends around the shower plate 31. The diffusion prevention wall 33 has an inner diameter set to be slightly larger than the outer diameter of the substrate W held on the substrate stage 20.

A disk-shaped metal prevention plate 34, which serves as a porous plate and which includes a plurality of through holes (second through holes), is attached in a removable manner to a lower end of the diffusion prevention wall 33 by a fastening member (not shown) such as a screw. The metal prevention plate 34 has an outer diameter that is substantially the same as that of the diffusion prevention wall 33. Accordingly, the metal prevention plate 34 covers the opening at the lower end of the diffusion prevention wall 33. The oxygen radicals drawn into the chamber 11 therefore pass through the through holes of the metal prevention plate 34 and are guided toward the substrate W on the substrate stage 20.

The metal prevention plate 34 is arranged in a buffer area 35, which is defined by the substrate stage 20, the upper part of the chamber 11, and the diffusion prevention wall 33. Furthermore, the metal prevention plate 34 is arranged in a region that is lower than the middle of the buffer area 35. The metal prevention plate 34 is also spaced apart from the upper surface of the substrate stage 20 so that it does not interfere with the loading and unloading of the substrate W.

A substrate guide 36 covers the upper peripheral part of the substrate stage 20. A lift pin 37 has a distal end arranged in the substrate stage 20 and supported to be movable in upward and downward directions. When the lift pin 37 moves upward, the substrate W can be transferred between the lift pin 37 and a conveying device (not shown). When the lift pin 37 moves downward, the substrate W supported by the lift pin 37 is arranged on the substrate stage 20.

An insulation plate 38 is arranged between the substrate stage 20 and the lower part of the chamber 11. A high frequency power supply 39 is connected to the substrate stage 20 via a capacitor C. The high frequency power supply 39 supplies a high frequency bias (RF bias) to the substrate stage 20. Furthermore, a pipe 40 is connected to the substrate stage 20. The pipe 40 supplies coolant to a coolant passage (not shown), which is formed in the substrate stage 20. This adjusts the temperature of the substrate stage 20.

Figure 3A:
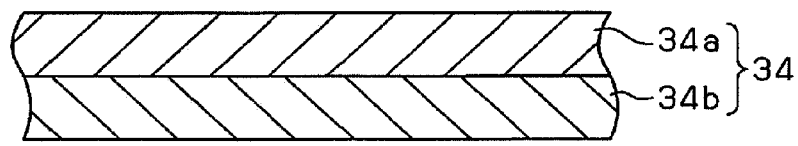
FIG. 3(a) is a schematic cross-sectional view of a metal prevention plate of the first embodiment.

As shown in FIG. 3(a), the metal prevention plate 34 includes a plurality of (two as shown in FIG. 3(a)) layers 34a and 34b. The upper first layer 34a, which serves as the oxygen radical entering side, is formed by a layer of metal oxides such as aluminum oxide and ittria ($Y_2O_3$). The second layer 34b located on the side facing toward the substrate W (lower side as viewed in FIG. 3) is formed from the same metal as the metal exposed from the substrate W processed in the chamber 11. For example, if copper is exposed from the substrate W, the second layer 34b of the metal prevention plate 34 arranged in the chamber 11 is formed from copper. In other words, the metal mainly exposed from the substrate W is used for the second layer 34b of the metal prevention plate 34. Therefore, in addition to copper (Cu), the second layer 34b may also use gold (Au), solder, platinum (Pt), and iridium (Ir). The metal prevention plate 34 may be formed, for example, by applying a metal oxide layer, which serves as the first layer 34a, on one surface of a metal plate, which serves as the second layer 34b.

The second layer 34b of the metal prevention plate 34 is electrically connected to the diffusion prevention wall 33, which is formed from aluminum or the like, by the fastening member, which is described above. The diffusion prevention wall 33 is electrically connected to the chamber 11, which is also formed from aluminum or the like, and the chamber 11 is connected to ground. Therefore, the metal prevention plate 34 (specifically, the second layer 34b that is formed from a metal) functions as an electrically opposite electrode of the substrate stage 20, to which is applied the high frequency bias from the high frequency power supply 39. The second layer 34b and the diffusion prevention wall 33 may be electrically connected by removing the first layer 34a from the peripheral portion of the second layer 34b and then connecting this portion of the second layer 34b to the lower end of the diffusion prevention wall 33.

Figure 3B:
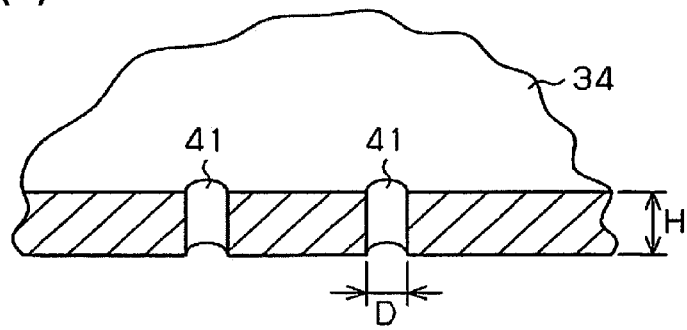
FIG. 3(b) is a perspective view showing part of the metal prevention plate of FIG. 3(a)

FIG. 3(b) is a cross-sectional perspective view showing part of the metal prevention plate 34. As shown in FIG. 3(b), the metal prevention plate 34 includes a plurality of through holes 41 (second through hole). Each of the through holes 41 has a hole diameter D set to prevent metal atoms, which are scattered from the exposed metal of the substrate W, from entering the buffer area 35. More specifically, an aspect ratio (H/D) representing the ratio of the plate thickness H of the metal prevention plate 34 and the hole diameter D of the through hole 41 is set to be greater than or equal to 0.5 and less than or equal to 2. This prevents metal atoms, except for those scattered from the substrate W immediately below the through holes 41 in the vertical direction, from passing through the through holes 41. In other words, even if metal atoms scattered from the substrate W enter the through holes 41, such metal atoms are efficiently collected on the inner surfaces of the through holes 41.

Figure 3C:
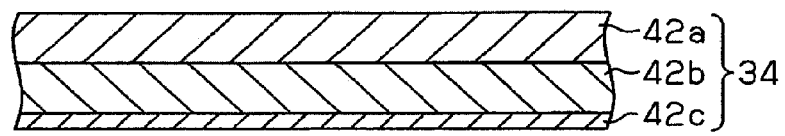
FIG. 3(c) is a schematic cross-sectional view showing a modification of the metal prevention plate.

In FIG. 3(a), instead of using the metal plate, a metal film may be formed on the surface of the metal prevention plate 34 facing toward the substrate W by performing sputtering, plating, spraying, or vapor deposition. In this case, for example, an aluminum plate may be used as a plate material (metal base plate) that serves as the base. As shown in FIG. 3(c), the metal prevention plate 34 may include three layers 42a to 42c. The first layer 42a is formed in the same manner as the first layer 34a. The second layer 42b is an aluminum plate, and the third layer 42c is a metal film applied to one surface of the second layer 42b. In the same manner as described above, copper (Cu), gold (Au), solder, platinum (Pt), and iridium (Ir) may be used for the metal film.

An ashing process performed with the ashing device of FIG. 1 will now be described.

First, the substrate W is arranged on the substrate stage 20 in the chamber 11 with the surface (processing surface) to which a resist film (organic material) that is to be removed facing upward. Oxygen radicals contained in a plasma are generated in the plasma chamber 13 are sent into the chamber 11. The oxygen radicals are diffused in the buffer area 35 by passing through the through holes of the shower plate 31 and the gap between the shower plate 31 and the upper inner surface 11a of the chamber 11. The oxygen radicals passing through the gap between the shower plate 31 and the upper inner surface 11a of the chamber 11 fall from between the shower plate 31 and the diffusion prevention wall 33. The diffusion prevention wall 33 restricts movement of the oxygen radicals in the radial direction, that is, unnecessary diffusion of the oxygen radicals. The oxygen radicals in the buffer area 35 then pass through the through holes 41 of the metal prevention plate 34 and reach the substrate W to react with the resist film of the substrate W and remove the resist film.

As described above, the metal prevention plate 34 includes a metal oxide layer (first layer 34a) serving as a passivation film on the upper surface as viewed in FIG. 2, that is, on the surface at the side to which oxygen radicals are supplied. Accordingly, the first layer 34a is unlikely to bond with the oxygen radicals since the first layer 34a, or the path through which the oxygen radicals pass, has already been oxidized. This prevents the oxygen radicals from being deactivated by the metal prevention plate 34 (first layer 34a), which has been added.

When the ashing process is performed on the substrate W from which a metal material is exposed, metal atoms are scattered from the substrate W when chemical reactions or physical reactions take place on the substrate surface. In this case, the metal prevention plate 34, which covers the upper side of the substrate W, functions as an opposite electrode of the high frequency bias in the ashing device of the first embodiment. Accordingly, scattered metal atoms are collected and deposited on the lower surface of the metal prevention plate 34 (second layer 34b). The lower surface, on which the metal atoms are collected, is arranged in a direction opposite to the supplying direction (advancing direction) of the oxygen radicals that reach the substrate W. Thus, the amount of oxygen radicals deactivated by the metal atoms collected on the lower surface of the metal prevention plate 34 is small. The scattered metal atoms also advance into the through holes 41 formed in the metal prevention plate 34. However, since the through holes 41 are formed to have the predetermined aspect ratio, the metal atoms become collected on the inner surfaces of the through holes 41, and the metal atoms subtly pass through the through holes 41. Furthermore, the metal exposed from the inner surfaces of the through holes 41 in the second layer 34b of the metal prevention plate 34, that is, the metal plate, is the same as the metals that are collected on the inner surfaces. Accordingly, even if metal atoms scattered from the substrate W are collected in the inner surface of the through holes 41 in the second layer 34b, the area of the metal exposed from the through holes 41 subtly changes. Thus, even if metal atoms are collected on the inner surfaces of the through holes 41, the amount of oxygen radicals that are deactivated is the same as when the metal atoms are not collected. For this reason, the change in the amount of deactivated oxygen radicals is extremely small regardless of the collection of the metal atoms, that is, the ashing process of the substrate W. In other words, even if the ashing process is performed on a large number of substrates W, the amount of oxygen radicals that reach the substrate W subtly changes. Therefore, the ashing rate subtly changes over time, that is, the processing efficiency is prevented from decreasing.

Most of the metal atoms scattered from the substrate W are collected on the lower surface of the metal prevention plate 34. This prevents the scattered atoms from collecting in the path through which the oxygen radicals pass (e.g., the upper inner surface 11a of the chamber 11, the lower surface of the shower plate 3, and the diffusion prevention wall 5). This maintains uniformity in the distribution of the metal atoms in the path. Furthermore, even if the metal atoms scattered from the substrate W are collected in a non-uniform manner on the lower surface of the second layer 34b of the metal prevention plate 34, the area in which the metal atoms are exposed from the lower surface of the second layer 34b subtly changes since the second layer 34b is formed from the same metal as the metal atoms scattered from the substrate W. In other words, uniformity of the metal distribution in the planar direction of the lower surface of the second layer 34b is maintained regardless of the collection of the metal atoms. Thus, even if the ashing process is performed on a large number of substrates W, the amount of oxygen radicals that reach the substrate W is uniform in the planar direction. In this manner, the in-surface uniformity of the substrate W for the ashing rate is prevented from being decreased.

Figure 4:
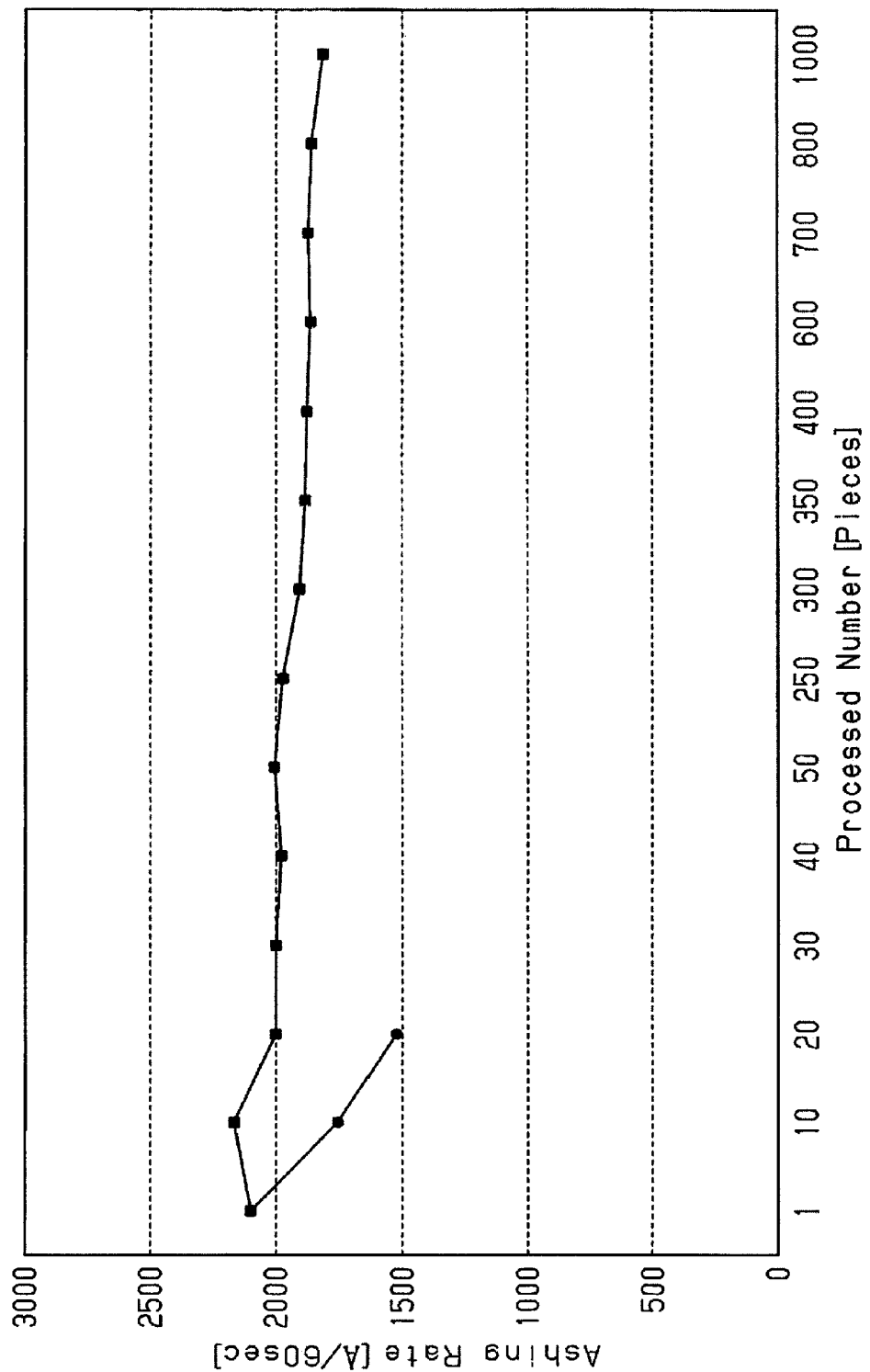
FIG. 4 is a chart showing changes in the ashing rate over time.
Figure 7:
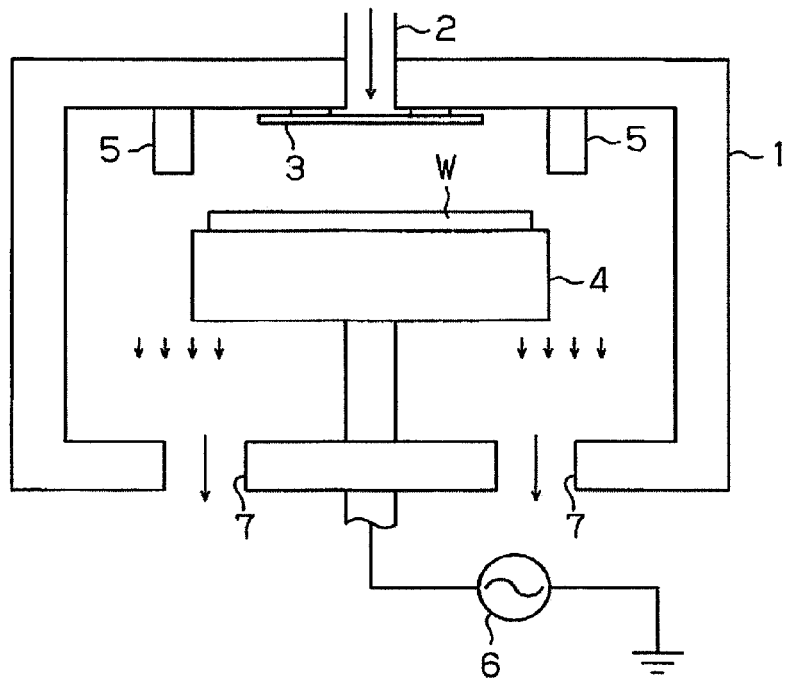
FIG. 7 is a schematic diagram of a prior art ashing device.
Figure 8:
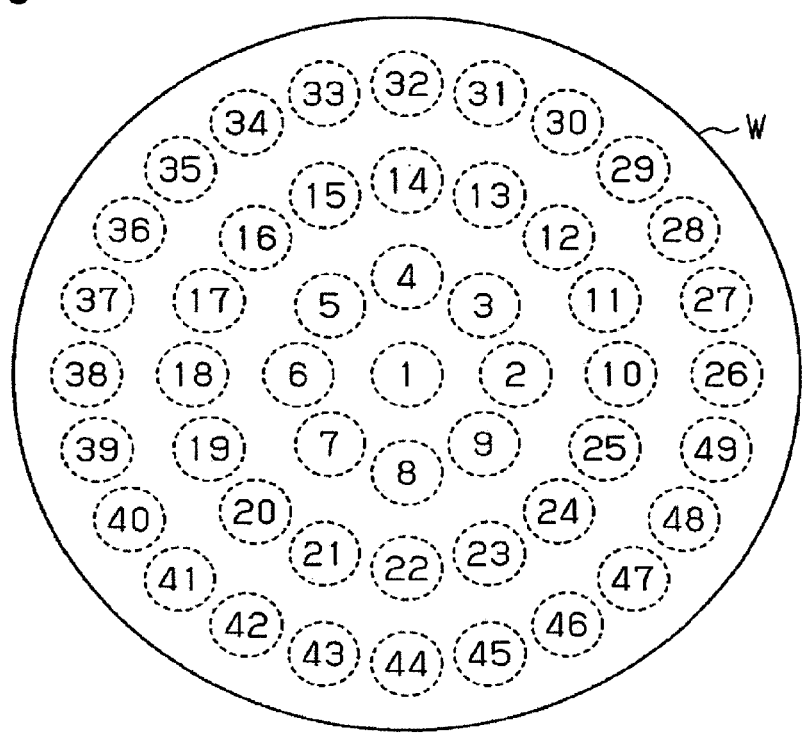
FIG. 8 is a plan view showing a plurality of measurement points on a substrate.
Figure 9A:
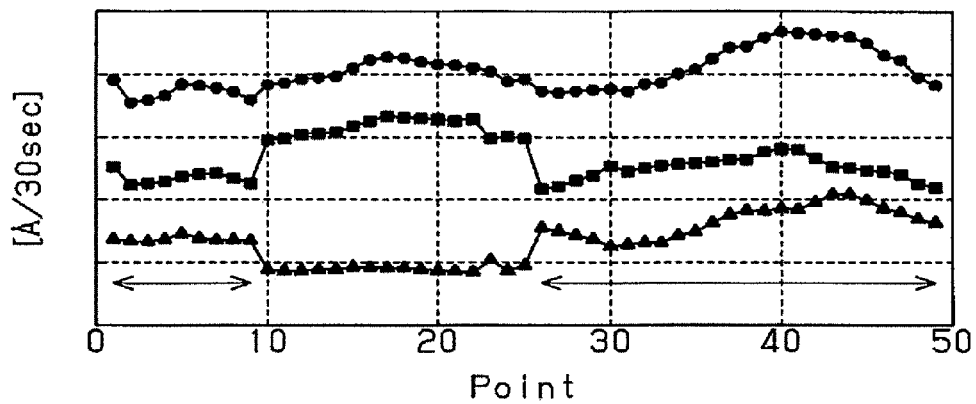
FIGS. 9(a) and 9(b) are charts showing the measurement results of the ashing depth at each measurement point of FIG. 8.
Figure 9B:
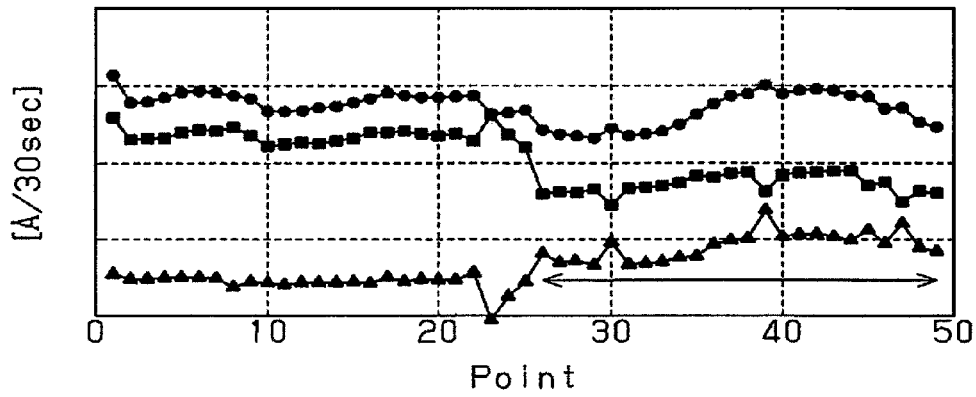
Figure 10A:
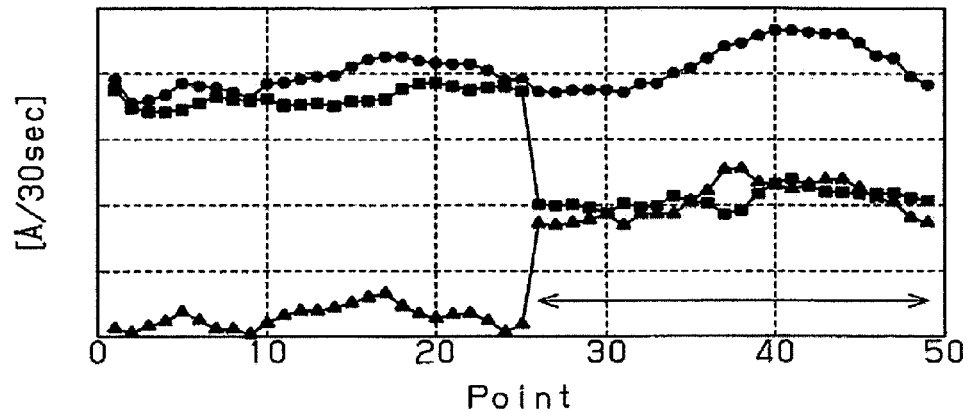
FIGS. 10(a) and 10(b) are charts showing the measurement results of the ashing depth at each measurement point of FIG. 8.
Figure 10B:
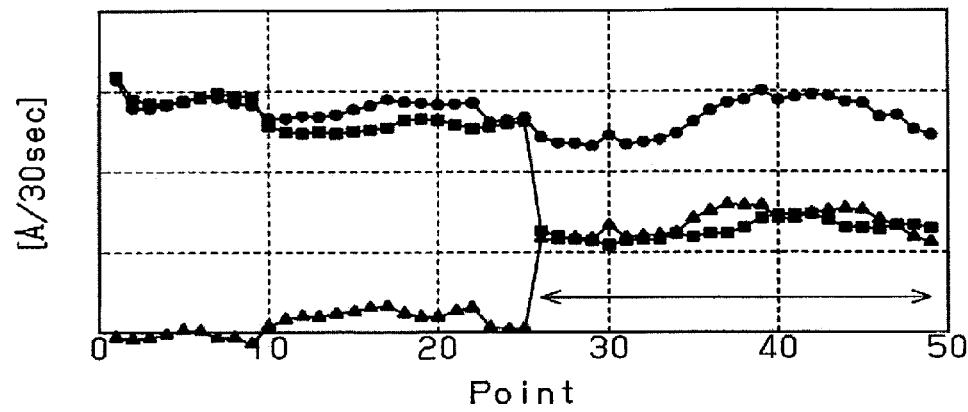

FIG. 4 is a graph showing changes in the ashing rate relative to the processed number of substrates W from which copper is exposed. In FIG. 4, the black squares represent the measurement results for when the ashing process is performed by the ashing device of the first embodiment. The black circles represent the measurement results for when the ashing process is performed with the ashing device of the prior art shown in FIG. 7. The conditions for processing the substrate W are set so that the flow rates for oxygen, nitrogen, and carbon tetrafluoride are respectively 1750 sccm, 250 sccm, and 500 sccm, the pressure of the chamber 11 is 100 Pa, the power of the microwaves is 2500 W, the RF bias is 300 W, and the processing time is 60 seconds. Here, the ashing rate corresponds to the average value of the ashing rates taken at the measurement points (see FIG. 8) of a single substrate.

As apparent from FIG. 4, after washing the chamber and the like, the ashing rate for the first substrate W that first undergoes the ashing process the first is substantially the same in the ashing device of the first embodiment and in the ashing device of the prior art. In the prior art ashing device (refer to black circles), the metal collected and deposited on the inner walls of the chamber 1 increases as the processed number increases. This drastically decreases the ashing rate. For the prior art ashing device, the ashing rate was measured for twenty substrates W. It can clearly be understood from the results of this experiment that the ashing rate drastically decreases over time in the ashing device of the prior art. In the prior art ashing device, the ashing rate of the twentieth substrate is decreased by about 30% from the ashing rate of the first substrate.

Comparatively, in the ashing device of the first embodiment (see black squares), even if the processed number increases, the ashing rate varies only slightly and the ashing rate remains high. More specifically, the ashing rate was higher when processing 1000 substrates with the ashing device of the first embodiment than when processing 10 substrates with the ashing device of the prior art. This is because the metal prevention plate 34 in the first embodiment prevents the ashing rate from decreasing over time. That is, the metal prevention plate 34 prevents the processing efficiency from changing over time.

Figure 5A:
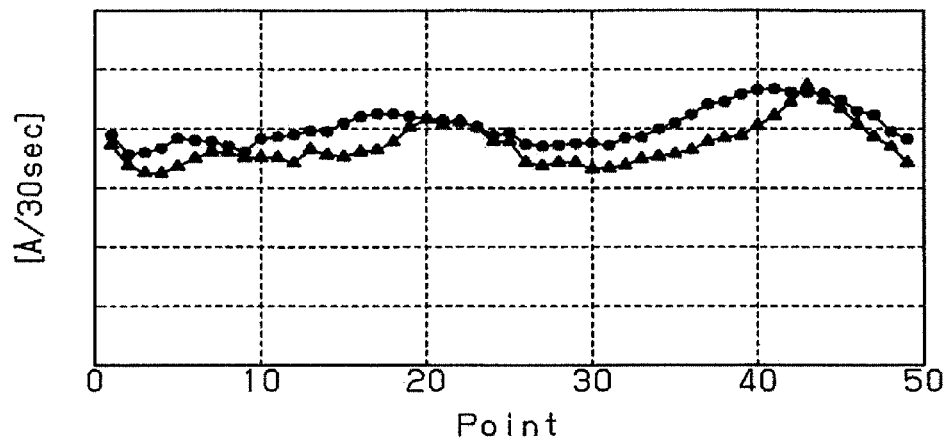
FIGS. 5(a) and 5(b) are charts showing the measurement results of the ashing rate at a plurality of measurement points on the substrate.
Figure 5B:
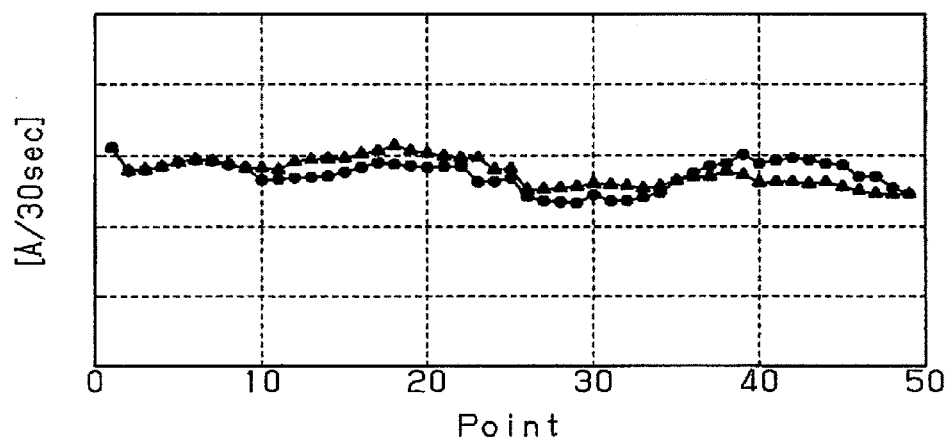

FIG. 5 shows the measurement result of the ashing rate at each measurement point (see FIG. 8) in the substrate W, from which copper is exposed. In FIG. 5, the black circles represent the measurement results for a substrate W that was first ashed by the ashing device of the prior art after the ashing device was washed. The black squares represent the measurement results for a plural ordinal number (e.g., tenth) of substrates W ashed by the ashing device of the first embodiment. FIG. 5(a) shows the measurement results for when the ashing process was performed on the substrate W under processing conditions A. The processing conditions A are set so that the flow rates for oxygen, nitrogen, and carbon tetrafluoride are respectively 2400 sccm, 320 sccm, and 480 sccm, the pressure in the chamber 11 is 125 Pa, the power of the microwaves is 2000 W, the RF bias is 500 W, and the processing time is 30 seconds. FIG. 5(b) shows the measurement result for when the ashing process was performed on the substrate W under processing conditions B. The processing conditions B are set so that the flow rates for oxygen and carbon tetrafluoride are respectively 1700 sccm and 300 sccm, the pressure in the chamber 11 is 85 Pa, the power of the microwaves is 1750 W, the RF bias is 0 W, and the processing time is 30 seconds.

As apparent from FIGS. 5(a) and (b), in the measurement results for the tenth substrate W obtained with the ashing device of the first embodiment and the measurement results for the first substrate obtained with the prior art ashing device, the ashing rates at each measurement point varied subtly under both processing conditions A and B. In other words, even after the performing the ashing process on a plurality of substrates W, the ashing device of the first embodiment obtains the same ashing rate at each measurement point as would be obtained by a first substrate. This indicates that the metal prevention plate 34 (second layer 34b) prevents the in-plane uniformity of the ashing rate for the substrate W from being decreased by the metal atoms scattered from the substrate W.

The ashing device of the first embodiment has the advantages described below.

(1) The metal prevention plate 34, which serves as a porous plate, is arranged between the shower plate 31 for diffusing oxygen radicals and the substrate stage 20 for holding the substrate W. The metal prevention plate 34 includes the first layer 34a, which is formed from a metal oxide layer and which is arranged on the oxygen radical entering side, and the second layer 34b, which is arranged on the side facing toward the substrate W and which is formed from the same metal as the metal exposed from the substrate W that undergoes the ashing process in the chamber 11. The metal prevention plate 34 includes the through holes 41, which extend through the first layer 34a and the second layer 34b. The metals scattered from the substrate W by surface reactions collect on the metal prevention plate 34 and do not enter the side of the metal prevention plate 34 from which oxygen radicals are supplied. This prevents the oxygen radicals passing through the metal prevention plate 34 from being deactivated. The second layer 34b of the metal prevention plate 34 facing toward the substrate W is formed from metal. Thus, even if the metals scattered from the substrate W collect on the metal prevention plate 34, the amount of deactivated oxygen radicals in the metal prevention plate 34 varies slightly. Therefore, the amount of oxygen radicals that reach the substrate W is prevented from varying over time. In other words, the processing efficiency when processing a resist film with oxygen radicals is prevented from decreasing over time.

Further, the lower surface of the metal prevention plate 34 is made from the same metal as the metal atoms scattered from the substrate W. Thus, even if the metal atoms scattered from the substrate W are collected on the metal prevention plate 34 in a non-uniform manner, the metal distribution at the lower surface of the metal prevention plate 34 is unlikely to become non-uniform. This prevents the in-surface uniformity of the ashing rate for the substrate W from decreasing.

(2) The chamber 11 includes the cylindrical diffusion prevention wall 33, which surrounds the shower plate 31, for inhibiting unnecessary diffusion of the oxygen radicals. The metal prevention plate 34 is removably attached to cover the lower end opening of the diffusion prevention wall 33.

Therefore, the unnecessary diffusion of the oxygen radicals diffused toward the periphery by the shower plate 31 is inhibited by the diffusion prevention wall 33, and the oxygen radicals are efficiently supplied to the substrate W.

(3) The metal prevention plate 34 is arranged to be lower than the middle part between the upper inner surface 11a of the chamber 11 and the upper surface of the substrate stage 20. Therefore, the metals scattered from the substrate W easily collects on the surface of the metal prevention plate 34 facing toward the substrate W.

(4) The metal oxide layer (first layer 34a) is formed on the surface of the metal prevention plate 34 arranged on the oxygen radical entering side (upper side as viewed in FIG. 3). In other words, the first layer 34a, which is the path through which oxygen radicals pass, in the metal prevention plate 34 has been oxidized in advance. Thus, the oxygen radicals are unlikely to bond with the first layer 34a. Accordingly, the first layer 34a optimally prevents the deactivated amount of oxygen radicals from being increased by the metal prevention plate 34, which has been added.

(5) The metal oxide layer is formed from aluminum oxides or ittria. This facilitates the formation of the metal oxide layer on the metal prevention plate 34.

(6) The aspect ratio of the hole diameter of the through hole 41 formed in the metal prevention plate 34 is set to be greater than or equal to 0.5 and less than or equal to 2. Accordingly, metals are prevented from passing through the through holes 41 and being scattered on the side in which oxygen radicals are supplied.

(7) The substrate stage 20 is connected to the high frequency power supply 39 for applying high frequency bias, and the metal prevention plate 34 is connected to the chamber 11 (specifically, the diffusion prevention wall 33) so as to function as an opposite electrode of the substrate stage 20. This further ensures that metal atoms scattered from the substrate W are collected on the metal prevention plate 34.

(8) The metal prevention plate 34 is formed by applying to a predetermined metal plate a film of the metal exposed from the substrate W. This facilitates formation of the metal prevention plate 34.

(9) The metal prevention plate 34 is formed by superimposing a metal oxide layer on a plate, which is formed from the metal that is exposed from the substrate W. This facilitates formation of the metal prevention plate 34.

[Second Embodiment]

A second embodiment of the present invention will now be discussed with reference to FIG. 6. The second embodiment differs from the first embodiment in the structure of the metal prevention plate 34. The differences from the first embodiment will mainly be discussed below. The ashing device of the second embodiment has substantially the same structure as the ashing device of the first embodiment shown in FIGS. 1 and 2.

Figure 6A:
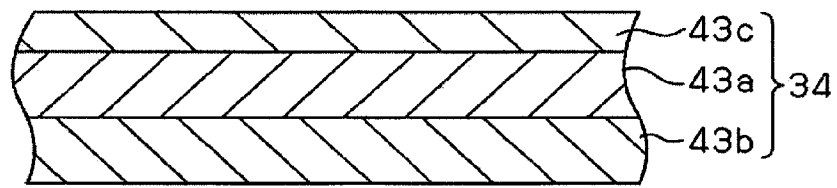
FIG. 6(a) is a schematic cross-sectional view showing a second embodiment of a metal prevention plate.

As shown in FIG. 6(a), the metal prevention plate 34 of the second embodiment includes three layers 43a, 43b, and 43c. In the same manner as the second layer 34b of the first embodiment, the third layer 43b (lower side as viewed in FIG. 6) facing toward the substrate W is a metal plate formed from the same metal as the metal exposed from the substrate W that undergoes ashing in the chamber 11. The second layer 43a is a metal oxide layer formed on an oxygen radical entering side surface of the third layer 43b. The first layer 43c is formed on the oxygen radical entering side surface of the second layer 43a and formed from a fluoride layer (fluoride film). The first layer 43c is a film formed by performing a fluorination treatment on the upper surface of the second layer 43a. The fluorination treatment may be performed, for example, raising the temperature of a subject member (second layer 34a and third layer 34b) and supplying gas that contains fluorine atoms.

As another example, fluorine plasma may be produced by using gas containing fluorine atoms, and the subject member may be arranged in such a plasma atmosphere. The gas that is used may contain at least one of CF4, C2F6, C3F8, NF3, and SF6.

The metal prevention plate 34, which includes the three layers 43a, 43b, and 43c, has a plurality of through holes in the same manner as in the first embodiment. The metal prevention plate 34 is attached in a removable manner to the lower end of the diffusion prevention wall 33 by a fastening member such as a screw.

In addition to advantages (1) to (9) of the first embodiment, the ashing device of the second embodiment has the advantages described below.

(10) The fluoride layer (first layer 43c) is formed on the surface of the metal prevention plate 34 that is located on the oxygen radical entering side. The fluoride layer functions as a passivation film. Thus, the upper surface of the metal prevention plate 34 is less likely to be oxidized compared to when the metal oxide layer of the second layer 43a is exposed. The oxygen radicals are thus less likely to bond to the fluoride layer of the first layer 43c. This effectively prevents the deactivated amount of oxygen radicals from being increased by the metal prevention plate 34, which is added. As a result, the overall ashing rate is improved.

The above embodiments may be modified as described below.

In the first embodiment, the first layers 34a and 42a formed from a metal oxide layer and shown in FIGS. 3(a) and 3(c) may be eliminated. In such a case, the amount of oxygen radicals that reach the substrate W is prevented from being varied over time by the metal plate (second layer 34b) or the metal film (third layer 42c) formed on the aluminum plate (42b). That is, the processing efficiency for ashing the resist film with oxygen radicals is prevented from decreasing over time.

In the second embodiment, the first layer 43c is formed (fluorination treatment) in a device that differs from the ashing device. However, the present invention is not limited in such a manner, and fluorination treatment using fluorine containing plasma may be performed on the metal prevention plate 34 in the ashing device after attaching the metal prevention plate 34, which includes the second layer 43a and the third layer 43b, to the ashing device.

Figure 6B:
FIG. 6(b) is a schematic cross-sectional view showing a modification of the metal prevention plate.

The metal prevention plate 34 in the second embodiment is not limited to a three-layer structure. As shown in FIG. 6(b), a metal plate 44a may be formed from the same metal as the metal exposed from the substrate W, and a fluoride layer 44b may be formed on the upper surface of the metal plate 44a (oxygen radical entering side, that is, the surface facing toward the diffuser plate).

Figure 6C:
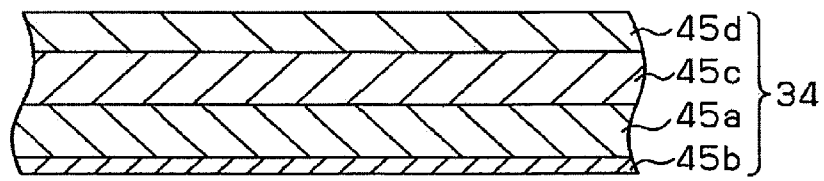
FIG. 6(c) is a schematic cross-sectional view showing a further modification of a metal prevention plate.

Further, as shown in FIG. 6(c), the metal prevention plate 34 may be formed by four layers 45a to 45d.

Describing each layer in detail, the layer (third layer) 45a is an aluminum plate arranged as a predetermined metal base plate. The layer (fourth layer) 45b, which is formed on the lower surface of the third layer 45a (surface facing toward the substrate W), is a metal film formed, for example, by sputtering the same metal as the metal exposed from the substrate W. The layer (second layer) 45c formed on the upper surface of the third layer 45a (oxygen radical introducing side) is a metal oxide. The first layer 45d formed on the upper surface of the second layer 45c is a fluoride layer formed by performing a fluorination treatment on the upper surface of the second layer 45c.

In each of the above embodiments, in addition to removing the resist film from the semiconductor substrate W, the ashing device may remove other films and organic materials, which are removable by plasma or radicals.

In each of the above embodiments, instead of using the oxygen plasma, the ashing device may use a different plasma (e.g., hydrogen plasma).

In each of the above embodiments, the ashing device is not limited to a plasma ashing device that uses oxygen plasma and may be a light excitation ashing device that generates oxygen radicals by irradiating ultraviolet light on ozone gas.

In each of the above embodiments, the types of gases supplied to the ashing device may be increased.

The invention claimed is:

1. A method for manufacturing an ashing device used for processing a substrate including an exposed metal film and for ashing organic material on the substrate in a processing chamber, the method comprising:
   arranging a stage which holds a substrate;
   arranging a diffuser plate facing toward the stage which diffuses active species supplied to the processing chamber and includes first through holes through which the active species pass; and
   arranging a porous plate between the stage and the diffuser plate, in which the porous plate includes,
   a metal base plate;
   a metal film, formed on the metal base plate from the first metal sputtered and scattered from the substrate by the active species and functioning as a metal layer facing towards the substrate; and
   a metal oxide layer formed on the metal base plate facing towards the diffuser plate and functioning as a passivation film facing towards the diffuser plate;
   and second through holes, through which the active species pass;
   wherein, the stage is connected to a high frequency power supply which applies a high frequency bias;
   the porous plate serves as a ground electrode that is connected to the processing chamber to function as an opposite electrode of the stage; and
   the first metal is one selected from a group consisting of copper (Cu), gold (Au), solder, platinum (Pt), and iridium (Ir).

2. The method for manufacturing an ashing device according to claim 1, further comprising:
   arranging a cylindrical diffusion prevention wall which includes a lower end opening and extends around the diffuser plate to prevent unnecessary diffusion of the active species;
   wherein the porous plate is attached in a removable manner to the diffusion prevention wall to cover the lower end opening.

3. The method for manufacturing an ashing device according to claim 2, wherein:
   the processing chamber includes an upper inner surface to which the diffuser plate is fixed; and
   the porous plate located at a position lower than a middle position between the upper inner surface of the processing chamber and the stage.

4. The method for manufacturing an ashing device according to claim 3, wherein the second through holes of the porous plate are formed to have an aspect ratio greater than or equal to 0.5 and less than or equal to 2, the aspect ratio representing the ratio of a plate thickness of the porous plate and a hole diameter of the second through hole.

5. The method for manufacturing an ashing device according to claim 2, wherein the second through holes of the porous plate are formed to have an aspect ratio greater than or equal to 0.5 and less than or equal to 2, the aspect ratio representing the ratio of a plate thickness of the porous plate and a hole diameter of the second through hole.

6. The method for manufacturing an ashing device according to claim 1, wherein:
   the processing chamber includes an upper inner surface to which the diffuser plate is fixed; and
   the porous plate located at a position lower than as middle position between the upper inner surface of the processing chamber and the stage.

7. The method for manufacturing an ashing device according to claim 1, wherein the second through holes of the porous plate are formed to have an aspect ratio greater than or equal to 0.5 and less than or equal to 2, the aspect ratio representing the ratio of as plate thickness of the porous plate and a hole diameter of the second through hole.

8. The method of manufacturing an ashing device according to claim 1, wherein the porous plate includes:
   a fluoride layer formed on the metal base plate and functioning as the passivation film facing toward the diffuser plate.

9. The method of manufacturing an ashing device according to claim 1, wherein the porous plate includes:
   a metal base plate formed from the same metal as the exposed metal and functioning as as the first layer facing toward the substrate;
   a metal oxide layer formed on the metal plate; and
   a fluoride layer is formed on the metal oxide layer and functioning as the passivation film facing toward the diffuser plate.

10. The method for manufacturing an ashing device according to claim 9, wherein the metal oxide layer is formed from an aluminum oxide or yttria.

11. The method of manufacturing an ashing device according to claim 1, wherein the porous plate includes:
    a metal base plate;
    a metal film formed on the metal base plate from the same metal as the exposed metal and functioning as the first layer facing toward the substrate;
    a metal oxide layer formed on the metal base plate; and
    a fluoride layer, formed on the metal oxide layer, functioning as the passivation film facing toward the diffuser plate.

12. The method of manufacturing an ashing device according to claim 11, wherein the metal oxide layer is formed from an aluminum oxide or yttria.

13. The ashing device according to claim 1, wherein the metal oxide layer is formed from an aluminum oxide or yttria.

* * * * *